(12) United States Patent
Kamiya

(10) Patent No.: US 10,340,478 B2
(45) Date of Patent: Jul. 2, 2019

(54) ORGANIC EL DISPLAY DEVICE AND METHOD OF MANUFACTURING AN ORGANIC EL DISPLAY DEVICE

(71) Applicant: Japan Display Inc., Minato-ku (JP)

(72) Inventor: Akinori Kamiya, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/890,752

(22) Filed: Feb. 7, 2018

(65) Prior Publication Data

US 2018/0248151 A1  Aug. 30, 2018

(30) Foreign Application Priority Data

Feb. 27, 2017  (JP) .................................. 2017-035290

(51) Int. Cl.
| | |
|---|---|
| *H01L 51/52* | (2006.01) |
| *H01L 27/32* | (2006.01) |
| *H01L 51/56* | (2006.01) |

(52) U.S. Cl.
CPC ...... *H01L 51/5253* (2013.01); *H01L 27/3262* (2013.01); *H01L 51/56* (2013.01); *H01L 27/3246* (2013.01); *H01L 27/3248* (2013.01); *H01L 2227/323* (2013.01); *H01L 2251/301* (2013.01); *H01L 2251/303* (2013.01)

(58) Field of Classification Search
CPC ............. H01L 27/3246; H01L 27/3262; H01L 51/5253; H01L 51/56
See application file for complete search history.

(56) References Cited

U.S. PATENT DOCUMENTS

| | | | | |
|---|---|---|---|---|
| 2014/0159002 | A1* | 6/2014 | Lee ..................... | H01L 27/3246 257/40 |
| 2015/0008406 | A1* | 1/2015 | Furuie ................ | H01L 51/5246 257/40 |
| 2015/0060821 | A1* | 3/2015 | Furuie ................ | H01L 51/5253 257/40 |
| 2017/0279071 | A1* | 9/2017 | Tamekawa ......... | H01L 27/3244 |
| 2017/0279084 | A1* | 9/2017 | Sakamoto ............ | H01L 27/322 |
| 2017/0365813 | A1* | 12/2017 | Kamiya ................ | G06F 3/0412 |

FOREIGN PATENT DOCUMENTS

JP  2015-49946  3/2015

* cited by examiner

*Primary Examiner* — Allan R Wilson
(74) *Attorney, Agent, or Firm* — Oblon, McClelland, Maier & Neustadt, L.L.P.

(57) ABSTRACT

An organic EL display device includes a thin film transistor substrate that has a circuit layer, a passivation layer, a lower electrode formed in each pixel in a display region, an organic material layer that is in contact with the lower electrode, an upper electrode that covers the organic material layer, and a sealing layer that entirely covers the base material. The thin film transistor substrate has the display region, and a moisture blocking region that surrounds the display region. On the moisture blocking region, the circuit layer, the passivation layer, the moisture blocking layer, and the sealing layer are laminated in this order. A composition of the moisture blocking layer is different from a composition of the sealing layer.

4 Claims, 7 Drawing Sheets

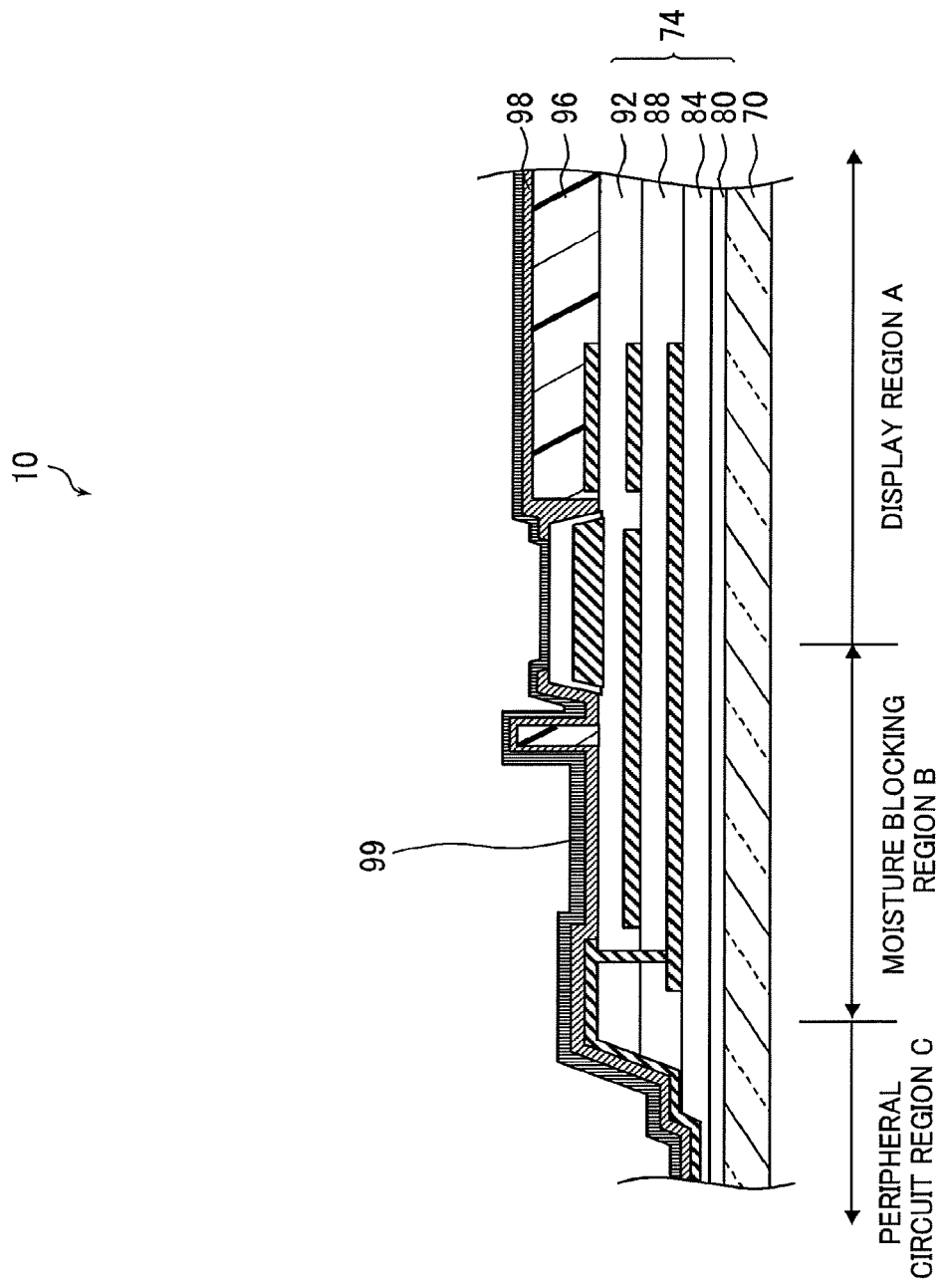

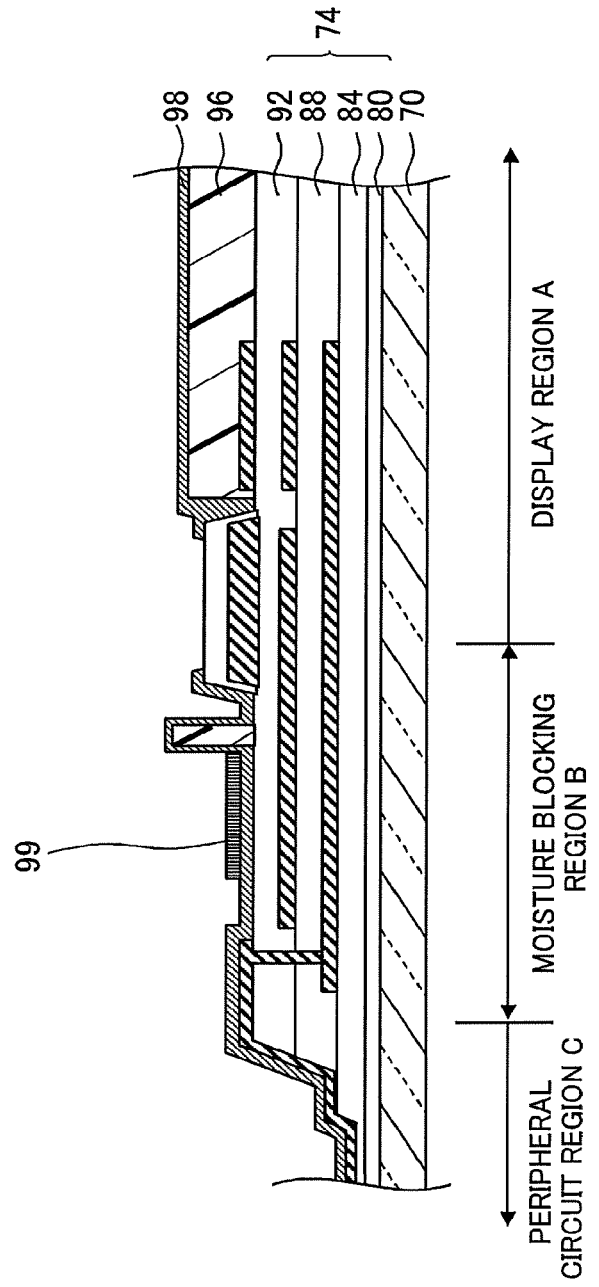

ORGANIC EL DISPLAY DEVICE AND METHOD OF MANUFACTURING AN ORGANIC EL DISPLAY DEVICE

CROSS-REFERENCE TO RELATED APPLICATION

The present application claims priority from Japanese Application JP2017-35290 filed on Feb. 27, 2017. The content of the application is hereby incorporated by reference into this application.

BACKGROUND OF THE INVENTION

1. Field of the Invention

One or more embodiments of the present invention relate to an organic electroluminescence (EL) display device, and a manufacturing method of an organic EL display device.

2. Description of the Related Art

An organic EL display device has a thin film transistor substrate on which a thin film transistor (TFT), an organic light emitting diode (OLED), and the like are formed. Patent Document 1 (Japanese Unexamined Patent Application Laid-Open No. 2015-049946) discloses a thin film transistor substrate that includes a display region, a moisture blocking region that surrounds an outer periphery of the display region, and a peripheral circuit region that surrounds the outer periphery of the moisture blocking region. The moisture blocking region is formed only of an inorganic material, and prevents moisture that has infiltrated from the peripheral circuit region side from spreading into the display region side.

SUMMARY OF THE INVENTION

On this thin film transistor substrate, a passivation layer and a sealing layer are formed in order to prevent moisture from infiltrating into an OLED and the like. The display region and the moisture blocking region are entirely covered by the sealing layer, but in the peripheral circuit region an unnecessary sealing layer is removed. In a process of removing the sealing layer in the peripheral circuit region, a mask is formed in the display region and the moisture blocking region, and the sealing layer in the peripheral circuit region is removed by dry etching. At that time, as a liquid material of the mask does not evenly spread in the moisture blocking region, a part of the sealing layer and the passivation layer in the moisture blocking region may be broken. If a breakage occurs in the moisture blocking region, moisture infiltrates from the broken part, and a problem such as the corrosion of wiring becomes likely to occur.

One or more embodiments of the present invention has been made in view of the above problems, and the object of one or more embodiments of the present invention is to prevent a breakage of a moisture blocking region that surrounds a outer periphery of a display region, and to provide an organic EL display device on which a corrosion of wiring and the like hardly occur and a manufacturing method of such an organic EL display device.

(1) In one or more embodiments of the present invention, an organic EL display device includes a thin film transistor substrate that has a circuit layer, a passivation layer, a lower electrode formed in each pixel in a display region, an organic material layer that is in contact with the lower electrode, an upper electrode that covers the organic material layer, and a sealing layer that entirely covers the base material. The thin film transistor substrate has the display region, and a moisture blocking region that surrounds the display region. On the moisture blocking region, the circuit layer, the passivation layer, the moisture blocking layer, and the sealing layer are laminated in this order. A composition of the moisture blocking layer is different from a composition of the sealing layer.

(2) In the organic EL display device as set forth in (1), an etching speed as to the moisture blocking layer is smaller than an etching speed as to the sealing layer.

(3) In the organic EL display device as set forth in (1) or (2), the sealing layer is formed of SiN, and the moisture blocking layer is formed of SiO or SiON.

(4) In one or more embodiments of the present invention, a manufacturing method of an organic EL display device includes: forming a circuit layer on a base material of a thin film transistor substrate; forming a passivation layer on the circuit layer; forming a moisture blocking layer on the passivation layer in a moisture blocking region that surrounds a display region; and forming a sealing layer so as to entirely cover the base material. A composition of the moisture blocking layer is different from a composition of the sealing layer.

According to one or more embodiments of the present invention, it becomes possible to prevent, on an organic EL display device, the breakage of the moisture blocking region that surrounds the outer periphery of the display region, and the occurrence of the corrosion of wiring and the like.

BRIEF DESCRIPTION OF THE DRAWINGS

FIG. 4B is a diagram that illustrates a formation step of the thin film transistor substrate according to the present embodiment.

FIG. 4C is a diagram that illustrates a formation step of the thin film transistor substrate according to the present embodiment.

DETAILED DESCRIPTION OF THE INVENTION

Figure 1:
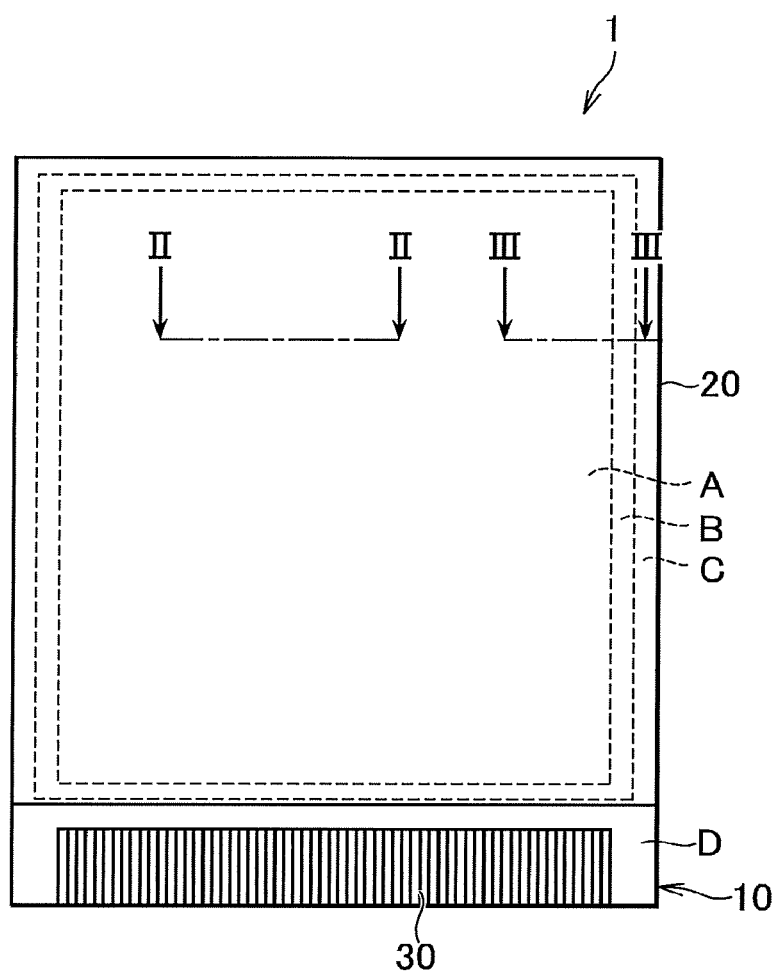
FIG. 1 is a schematic planar diagram of an organic EL display device according to a present embodiment.

Below, embodiments of the present invention are explained with reference to the accompanying drawings.

While the width, thickness, shape, and the like of each element in the drawings referred to in the below explanation may be illustrated schematically as compared with actual embodiments in order to clarify the explanation, such schematic illustration merely shows an example and an interpretation of the present invention should not be limited thereto. Furthermore, in the specification and the respective drawings, the same reference symbols may be applied to elements similar to those that have already been illustrated in another drawing and a detailed explanation of such elements may be omitted as appropriate.

FIG. 1 is a schematic planar diagram of an organic EL display device 1 according to the present embodiment. The organic EL display device 1 has a thin film transistor substrate 10, and an opposing substrate 20 disposed so as to be opposed to a part of the thin film transistor substrate 10. The thin film transistor substrate 10 has, as illustrated in FIG. 1, a display region A that is a region to display an image, a moisture blocking region B that surrounds the outer periphery of the display region, a peripheral circuit region C that surrounds the outer periphery of the moisture blocking region B, and a component mounting region D.

The display region A is a region that has a substantially rectangular shape, and OLEDs (not illustrated) are arranged in a matrix shape, corresponding to pixels. The moisture blocking region B is a region that has a frame-like shape that surrounds the display region A in the substantially rectangular shape. The peripheral circuit region C is a frame-like region that surrounds the moisture blocking region B. The specific configurations of the display region A, the moisture blocking region B, and the peripheral circuit region C will be described later.

The component mounting region D is a region of the thin film transistor substrate 10 as to which there exists no opposing substrate 20 at a position the component mounting region D faces to. On the component mounting region D, an external connection terminal 30 is formed. Further, on the component mounting region D, a driver IC and other components may be provided. The external connection terminal 30 is a terminal to which an external device is electrically connected, and is electrically connected to the external device via FPC, for example. The external connection terminal 30 is supplied with image data from the external device, to thereby supply an OLED with an electric voltage signal to be applied to each pixel via an unillustrated driver IC. In FIG. 1, the component mounting region D is formed on one side of the thin film transistor substrate 10, but it may be formed on two or more sides thereof.

Below, the specific configuration of the display region A, the moisture blocking region B, and the peripheral circuit region C of the thin film transistor substrate 10 is explained.

Figure 2:
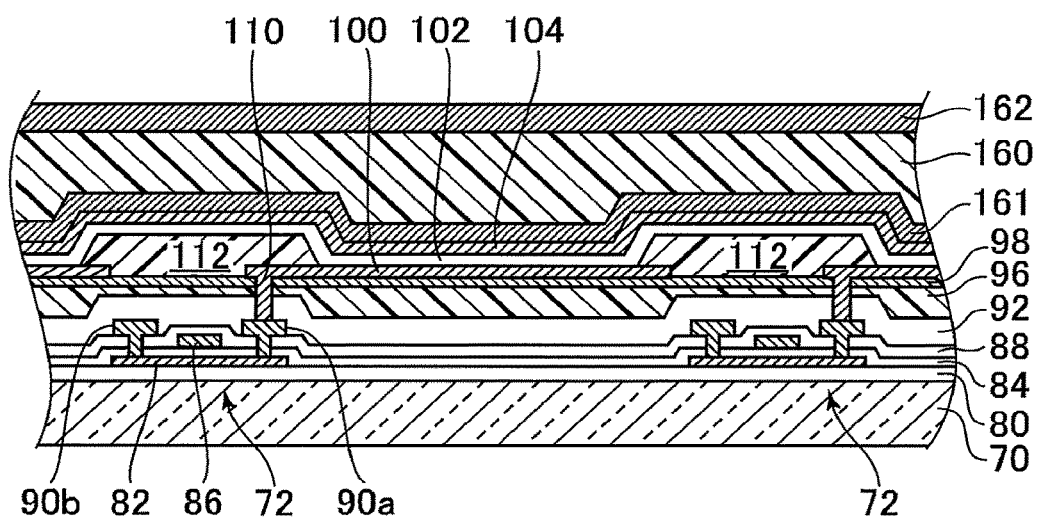
FIG. 2 is a II-II cross sectional diagram of the organic EL display device illustrated in FIG. 1.

FIG. 2 is a II-II cross sectional diagram of the organic EL display device 1 illustrated in FIG. 1. FIG. 2 illustrates a schematic cross sectional diagram of the display region A of the thin film transistor substrate 10, but the opposing substrate 20 is omitted. In the display region A of the thin film transistor substrate 10, on the base material 70, a circuit layer 74 including a TFT 72, a planarization film 96, a passivation layer 98, the OLED, and a sealing layer 106 are formed in order. As the base material 70, a glass substrate, a resin film, or the like is used.

The circuit layer 74 of the display region A is a layer where the TFT 72, other unillustrated electric wirings, and the like are formed, and is formed to drive the OLED. Further, at least a part of a driving part can be formed on the base material 70 as the circuit layer 74, in a region adjacent to the display region A. Moreover, the driver IC and the FPC that constitute the driving part can be connected to an electric wiring of the circuit layer 74 in the peripheral circuit region C and the component mounting region D.

Specifically, an under layer 80 made of an inorganic insulating material such as silicon nitride (SiNy) and silicon oxide (SiOx) on the base material 70, and on this a semiconductor region 82 is formed. The semiconductor region 82 becomes a channel part and a source/drain part of a top gate type TFT 72. The semiconductor region 82 is made of polysilicon (p-Si), for example, and it is formed by patterning the p-Si film and selectively leaving the p-Si film at a position where it is used in the circuit layer 74. A gate insulating film 84 is formed on the channel part of the TFT 72, a gate electrode 86 is formed thereon, and an interlayer insulating film 88 is formed so as to cover the gate electrode 86. As the gate insulating film 84, TEOS is used, for example. The gate electrode 86 is formed by patterning a metal film formed by sputtering or the like. Impurities are introduced into the semiconductor region 82 to be the source part and the drain part of the TFT 72 by ion injection, and a source electrode 90a to be electrically connected to the source part of the TFT 72 and a drain electrode 90b to be electrically connected to the drain part of the TFT 72 are formed. After the TFT 72 is thus formed, the interlayer insulating film 92 is formed so as to cover the TFT 72, and the planarizing film 96 made of an organic material such as acrylic resin is formed on the interlayer insulating film 92.

In the display region A, the OLEDs that correspond to the respective pixels are formed on the passivation layer 98. Each OLED is constituted by a lower electrode 100, an organic material layer 102, and an upper electrode 104. The lower electrode 100, the organic material layer 102, and the upper electrode 104 are laminated in this order from the base material 70 side. In the present embodiment, the lower electrode 100 is an anode of the OLED, and the upper electrode 104 is a cathode. The organic material layer 102 is configured to include a hole transport layer, a light emitting layer, an electron transport layer, and the like.

The lower electrode 100 is the anode of the OLED, and injects a driving electric current into the organic material layer 102. The lower electrode 100 is formed in each pixel in the display region A. Specifically, after the planarizing film 96 described above is formed, a contact hole 110 to connect the lower electrode 100 to the TFT 72 is formed, and a conductive film 111 (e.g., an ITO film) is formed inside the contact hole 110. Thereafter, the passivation layer 98 that covers the entire base material 70 is formed on the planarizing film 96 and the conductive film 111. Then, by removing the passivation layer 98 formed on the conductive film 111 and patterning the lower electrode 100 on the conductive film 111, the lower electrode 100 connected to the TFT 72 is formed in each pixel. The lower electrode 100 is made of a material that is conductive, which for example is preferably ITO, but it may also be made of a material that is light transmitting and conductive such as IZO, zinc oxide, indium oxide, aluminum oxide multiple oxide.

After forming the lower electrode 100, a rib 112 is formed at a border between pixels. In an effective region of a pixel surrounded by the rib 112, the lower electrode 100 is not covered by the rib 112. After forming the rib 112, the organic material layer 102 is formed on the lower electrode 100.

The organic material layer 102 is a layer which at least has the light emitting layer, and is formed so as to be in contact with the lower electrode 100. The organic material layer 102 is configured to include the hole transport layer, the light emitting layer, the electron transport layer, and the like, for example. The light emitting layer is composed of an organic electroluminescence substance that emits light by recombination of holes and electrons, for example. As the organic electroluminescence substance like this, a general organic light emitting material, for example, may be used.

The upper electrode 104 is formed so as to cover the organic material layer 102 of the entire display region A. As the upper electrode 104 has the configuration like this, the upper electrode 104 is in contact with the organic material layers 102 of a plurality of the OLEDs in the display region A. The upper electrode 104 is made of a material that is light transmitting and conductive, and is preferably ITO for example, but it may be something made by mixing metal such as silver and magnesium into conductive metal oxide such as ITO and InZnO, or something made by laminating a metal thin film made of silver, magnesium, or the like and conductive metal oxide.

The sealing layer 106 is formed on the upper electrode 104 so as to cover the entire base material 70. The sealing layer 106 is formed to cover the entire base material 70, to thereby prevent infiltration of oxygen and moisture into the respective layer such as the circuit layer 74 and the OLED. The sealing layer 106 is configured to include the organic layer 160 and a first inorganic layer 161 and a second inorganic layer 162 that sandwich the organic layer from the upper side and the lower side.

Figure 3:
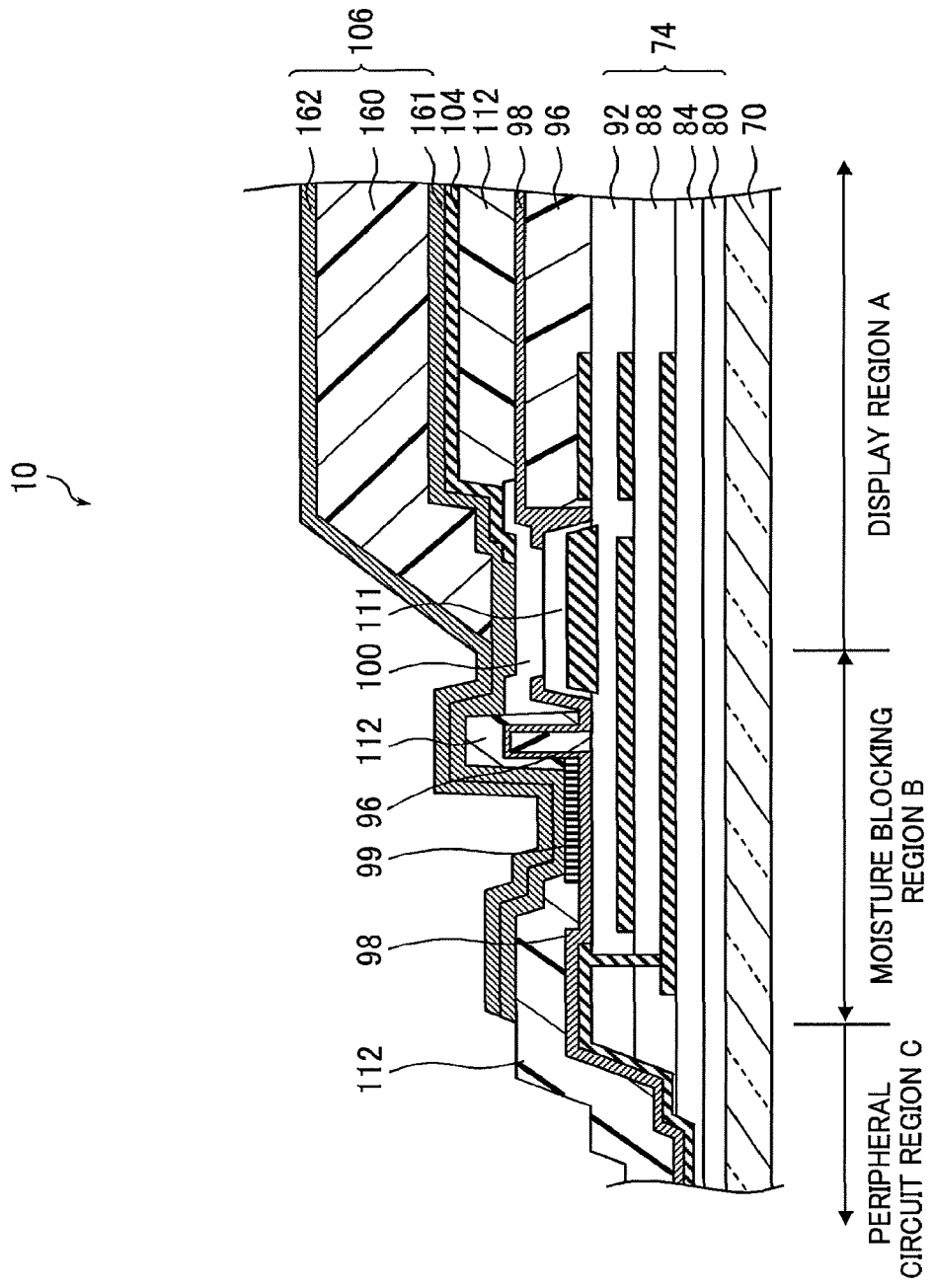
FIG. 3 is a III-III cross sectional diagram of the organic EL display device illustrated in FIG. 1.

FIG. 3 is a III-III cross sectional diagram of the organic EL display device 1 illustrated in FIG. 1. FIG. 3 illustrates a schematic cross sectional diagram around the moisture blocking region B of the thin film transistor substrate 10, and the opposing substrate 20 is omitted. The moisture blocking region B is a region that surrounds the outer periphery of the display region A, and prevents moisture that has infiltrated from the peripheral side of the thin film transistor substrate 10 (e.g., from the peripheral circuit region C side) from spreading into the display region A side. The moisture blocking region B prevents the infiltrated moisture from spreading, as it is constituted by an inorganic material.

The moisture blocking region B of the thin film transistor substrate 10 is different from the display region A at least in that it does not include the TFT 72 and the OLED. Specifically, in the moisture blocking region B of the thin film transistor substrate 10, the circuit layer 74, the passivation layer 98, the moisture blocking layer 99, and the sealing layer 106 are formed in order on the base material 70.

In the circuit layer 74 of the moisture blocking region B, an electric wiring and the like are formed. Further, on the circuit layer 74, the passivation layer 98 is formed. The passivation layer 98 is formed of SiN, for example. Moreover, on the passivation layer 98, the moisture blocking layer 99 is formed, and the sealing layer 106 is formed thereon. In the moisture blocking region B, the sealing layer 106 does not include the organic layer 160, but is constituted by the first inorganic layer 161 and the second inorganic layer 162.

In the peripheral region C and the component mounting region D, the sealing layer 106 is not provided so that the various types of components can be connected easily. Especially in the component mounting region D, the sealing layer 106 is removed that is unnecessary for a connection of the driver IC and an external device to the external connection terminal 30. In a process to remove the sealing layer 106 in the peripheral circuit region C and the component mounting region D, after the formation of the sealing layer 106 over the entire base material 70, a mask is formed on the sealing layer 106 of the display region A and the moisture blocking region B, using the inkjet method. Further, by the dry etching with that mask, the sealing layer 106 of the peripheral circuit region C and the component mounting region D is removed. At that time, the material liquid of the mask may not be evenly spread in the moisture blocking region B. Also, unless the mask is sufficiently formed on the sealing layer 106 of the moisture blocking region B, the sealing layer 106 and the passivation layer 98 in the moisture blocking layer B may be broken by the etching, and that may cause an infiltration of moisture into the circuit layer 74 and the like from the broken part, and as a result corrosion of the wiring may occur.

Thus, in the present embodiment, the moisture blocking layer 99 whose composition is different from that of the sealing layer 106 is formed between the passivation layer 98 and the sealing layer 106 in the moisture blocking region B. In the present embodiment, it is sufficient if the composition of the moisture blocking layer 99 is different from that of the first inorganic layer 161 and the second inorganic layer 162. Here, the phrase, "the composition is different" between two layers means that kinds of elements that respectively constitute the two layers are different and/or the composition rates of elements are different, between the two layers, for example. Specifically, the moisture blocking layer 99 has a composition that is etched more hardly than the sealing layer 106 is, which means a composition with which the etching speed is small. For example, in a case where the sealing layer 106 (the first inorganic layer 161 and the second inorganic layer 162) is formed of SiN, it is preferable that the moisture blocking layer 99 is formed of SiO or SiON. Note that the moisture blocking layer 99 may have a multilayered structure composed of a layer formed of SiO and a layer formed of SiON. Further, in a case where the sealing layer 106 is formed of SiON, it is preferable that the moisture blocking layer 99 is formed of SiO. As seen above, the moisture blocking layer 99 that has a composition which is more hardly etched than the sealing layer 106 is hardly etched in the process of etching the sealing layer 106, and therefore can protect the passivation layer 98 that is formed under the moisture blocking layer 99.

According to the present embodiment, as the moisture blocking layer 99 that is more hardly etched than the blocking layer 106 is (which means that the moisture blocking layer 99 with which the etching speed is small) formed, the breakage of the passivation layer 98 in the etching process of the sealing layer 106 can be prevented, and as a result the infiltration of moisture into the circuit layer 74 and the like can be prevented.

Figure 4A:
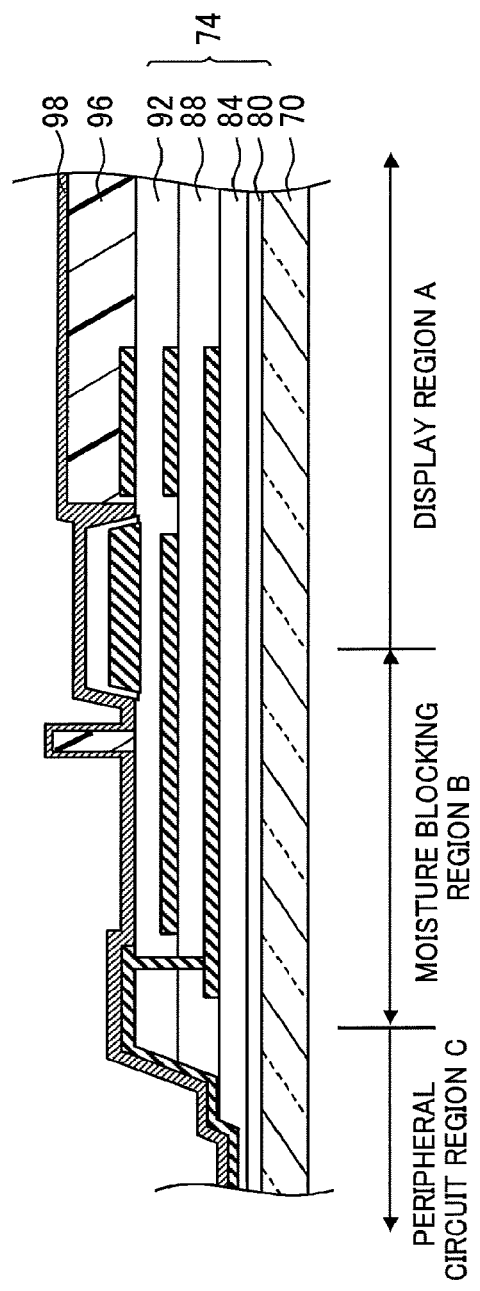
FIG. 4A is a diagram that illustrates a formation step of a thin film transistor substrate according to the present embodiment.
Figure 4D:
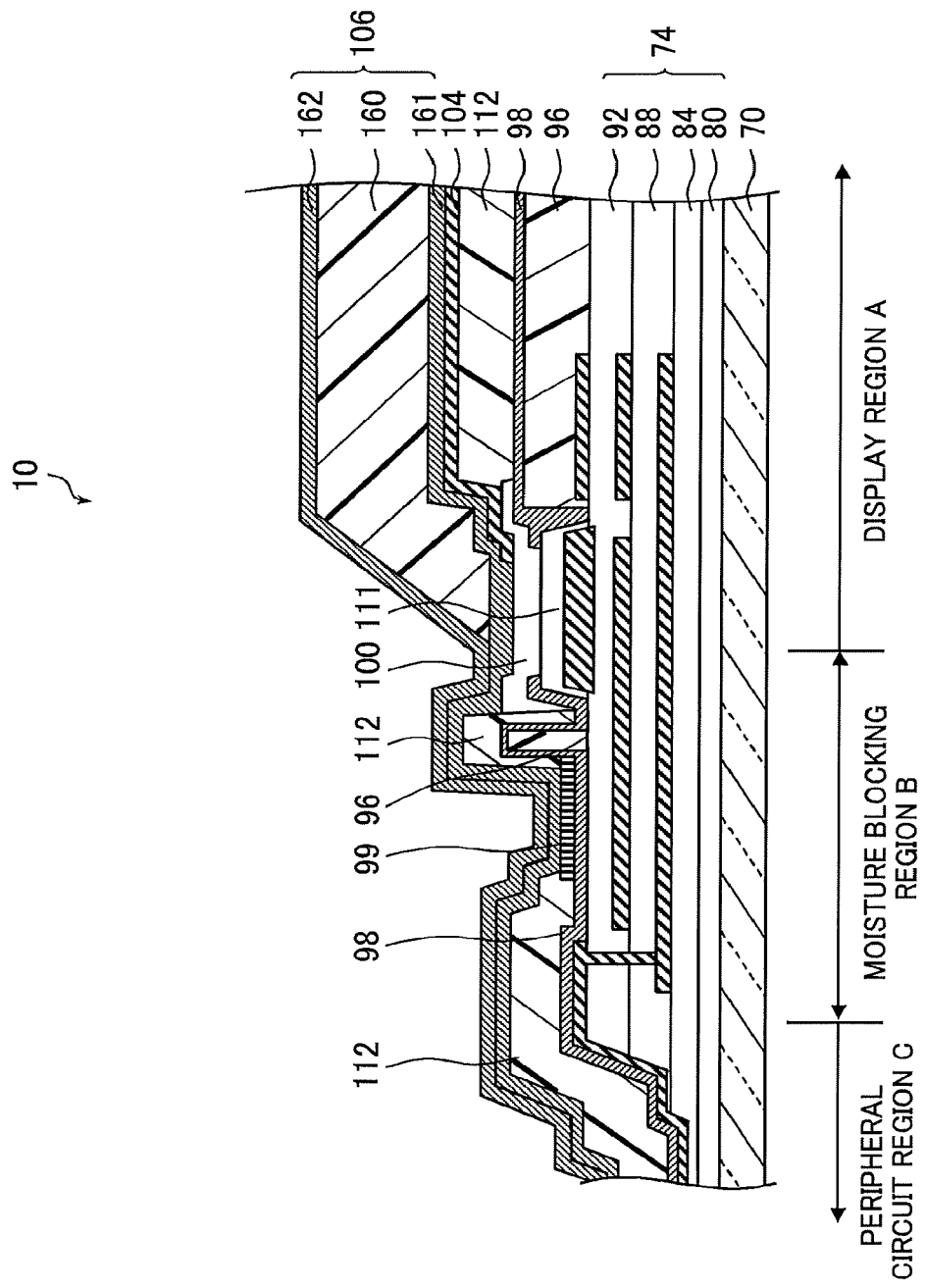
FIG. 4D is a diagram that illustrates a formation step of the thin film transistor substrate according to the present embodiment.

Here, the manufacturing method of the organic EL display device 1 according to the present embodiment is explained with reference to FIGS. 4A~4D. FIGS. 4A~4D are diagrams that illustrate the formation process of the thin film transistor substrate 10 included in the organic EL display device 1 according to the present embodiment. Note that the formation process of base material 70 to the planarizing film 96 is the same as the one given in the explanation of the configuration of the display region A, and therefore is not explained here. After the planarizing film 96 has been formed, as the passivation layer 98, SiN film, for example, is formed by the chemical vapor deposition (CVD) method so as to cover the entire base material 70 (FIG. 4A). Next, after the passivation layer 98 formed on the conductive film 92 is removed so that the conductive film 92 is not covered, on the passivation layer 98, an SiO film is formed as the moisture blocking layer 99 by the CVD method, for example (FIG. 4B). After that, by patterning the SiO film with a photoresist made of photosensitive resin, the moisture blocking layer 99 is formed in the moisture blocking region B (FIG. 4C). Then, after the OLED and the like are formed in the display region A, the sealing layer 106 is formed so that it covers the entire base material 70 (FIG. 4D). After that, the mask is formed by the inkjet method on the sealing layer 106 in the display region A and the moisture blocking region B, and the dry etching is carried out with that mask. In this way, the sealing layer 106 in the peripheral circuit region C is removed, and the thin film transistor substrate 10 illustrated in FIG. 2 is formed.

Further, onto the sealing layer 106 of the thin film transistor substrate 10 that has been formed as described above, the opposing substrate 20 is bonded with an interposition of an unillustrated protecting film, to thereby form the organic EL display device 1.

While there have been described what are considered to be certain embodiments of the present invention, the present invention is not limited to the embodiments as have been described above. For example, the configuration explained as to the above embodiments can be replaced with a configuration that is substantially the same as the one that has been explained, a configuration that exhibits the same technical effect, or a configuration that can achieve the same objective.

What is claimed is:

1. An organic EL display device, comprising:
    a thin film transistor substrate including a circuit layer, a passivation layer, a lower electrode formed in each pixel in a display region, an organic material layer that is in contact with the lower electrode, an upper electrode that covers the organic material layer, and a sealing layer that entirely covers a base material, the sealing layer including a first inorganic layer and a second inorganic layer, wherein
    the thin film transistor substrate has the display region, and a moisture blocking region that surrounds the display region,
    on the moisture blocking region, the circuit layer, the passivation layer, a moisture blocking layer not provided in the display region, and the sealing layer are laminated in this order, and
    a composition of an inorganic material forming the moisture blocking layer is different from a composition of an inorganic material forming the first and second inorganic layer of the sealing layer, and
    the moisture blocking layer is in contact with the first inorganic layer, and the first inorganic layer is in contact with the second inorganic layer on the moisture blocking layer.

2. The organic EL display device according to claim 1, wherein
    an etching speed as to the moisture blocking layer is smaller than an etching speed as to the sealing layer.

3. The organic EL display device according to claim 1, wherein
    the sealing layer is formed of SiN, and
    the moisture blocking layer is formed of SiO or SiON.

4. A manufacturing method of an organic EL display device, comprising:
    forming a circuit layer on a base material of a thin film transistor substrate;
    forming a passivation layer on the circuit layer,
    forming a moisture blocking layer on the passivation layer in a moisture blocking region that surrounds a display region and that is not provided in the display region; and
    forming a sealing layer so as to entirely cover the base material, the sealing layer including a first inorganic layer and a second inorganic layer, wherein
    a composition of an inorganic material forming the moisture blocking layer is different from a composition of an inorganic material forming the first and second inorganic layers of the sealing layer,
    the moisture blocking layer is in contact with the first inorganic layer, and the first inorganic layer is in contact with the second inorganic layer on the moisture blocking layer.

* * * * *